US009780787B2

(12) United States Patent
Cho et al.

(10) Patent No.: US 9,780,787 B2
(45) Date of Patent: Oct. 3, 2017

(54) SELF-REPARABLE DIGITAL DEVICE FOR MULTIPLE FAULTS BASED ON BIOLOGICAL ATTRACTOR CONCEPTS

(71) Applicant: Korea Advanced Institute of Science and Technology, Daejeon (KR)

(72) Inventors: Kwang Hyun Cho, Daejeon (KR); I Saak Yang, Daejeon (KR); Sung Hoon Jung, Gyeonggi-do (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 613 days.

(21) Appl. No.: 14/228,522

(22) Filed: Mar. 28, 2014

(65) Prior Publication Data
US 2014/0298143 A1    Oct. 2, 2014

(30) Foreign Application Priority Data

Mar. 28, 2013  (KR) .................. 10-2013-0033843
Feb. 5, 2014   (KR) .................. 10-2014-0013108

(51) Int. Cl.
   *H03M 13/03*    (2006.01)
   *H03M 13/00*    (2006.01)
   *G11C 29/00*    (2006.01)
   *H03K 19/003*   (2006.01)

(52) U.S. Cl.
   CPC ........... *H03K 19/003* (2013.01); *G11C 29/76* (2013.01)

(58) Field of Classification Search
   None
   See application file for complete search history.

(56) References Cited

U.S. PATENT DOCUMENTS

| 7,320,091 | B2 | 1/2008 | Blaauw et al. | |
| 8,826,064 | B2* | 9/2014 | Boesen | G06F 8/31 714/10 |
| 2011/0302119 | A1* | 12/2011 | Nugent | G06N 3/082 706/27 |

FOREIGN PATENT DOCUMENTS

| KR | 101032000 B1 | 5/2011 |
| KR | 101137771 B1 | 4/2012 |

OTHER PUBLICATIONS

Das et al., "RazorII: In Situ Error Detection and Correction for PVT and SER Tolerance", IEEE Journal of Sold-State Circuits, vol. 44, No. 1, Jan. 2009, pp. 32-48.
Lin et al., "SETTOFF: a fault tolerant flip-flop for building cost-efficient reliable systems." IOLTS 2012; 18th IEEE International On-Line Testing Symposium, Sitges, ES Jun. 27-29, 2012, pp. 7-12.

* cited by examiner

*Primary Examiner* — Justin R Knapp
(74) *Attorney, Agent, or Firm* — Mayer & Williams, PC; Stuart Mayer

(57) ABSTRACT

Provided is a fault self-repairing circuit sequentially converting an N-bit output value according to a pre-determined schedule and outputting the converted result. The fault self-repairing circuit includes different N logic modules configured to output each bit of the N bits. Here, each of the logic modules includes an internal logic. When the N-bit output value is identical to a pre-determined value, an output value of each of the logic modules is provided by the internal logic, and, when the N-bit output value is not identical to the pre-determined value, the output value of each of the logic modules is provided with a correct value provided outside each of the logic modules.

9 Claims, 14 Drawing Sheets

PRIOR ART

PRIOR ART

PRIOR ART

* INPUTS AND OUTPUTS OF 13 MAY BE DETERMINED
  BY THE MAPPING TABLE ACCORDING TO FIG. 8H

SELF-REPARABLE DIGITAL DEVICE FOR MULTIPLE FAULTS BASED ON BIOLOGICAL ATTRACTOR CONCEPTS

CROSS-REFERENCE TO RELATED APPLICATION

This application claims priority to Korean Patent Application No. 10-2013-0033843 filed on Mar. 28, 2013 and 10-2014-0013108 filed on Feb. 5, 2014 and all the benefits accruing therefrom under 35 U.S.C. §119, the contents of which are incorporated by reference in their entirety.

BACKGROUND

The present disclosure relates to a digital circuit structure and a circuit design method, which recovers multiple faults by itself.

The present disclosure is inspired from a biological attractor concept, and in particular, from an attractor landscape of a Boolean network.

In a gene expression system in a living organism, whether an arbitrary gene or protein is expressed or not may be defined into two states of expression and non-expression. Here, whether the arbitrary gene or protein is expressed or not may be determined by whether other linked genes or proteins are expressed or not.

FIGS. 1 to 3 are views for explaining robustness with respect to perturbation in a gene expression system in a living organism by using an attractor landscape.

FIG. 1 illustrates a bio regulatory network modeled as a Boolean network model. Referring to FIG. 1, it may be modeled such that, when an activation level of a gene or protein corresponding to a node (depicted as a circle) is greater than a threshold value, the corresponding node has a value '1', and, when an activation level of the corresponding node is smaller than the threshold value, the corresponding node has a value '0'.

In addition, a link (depicted as an arrow) connecting the nodes in FIG. 1 denotes a path which shows interaction each other nodes. In detail, the link denotes an activation relationship or an inhibiting relationship. A state of one node among the nodes may be determined by a control type (activation relationship or inhibition relationship) of a link connected thereto with an arrow and a previous state value of nodes connected through the link.

The bio regulatory network may have any one state among maximum $2^N$ states which are defined by possible combinatial state values of N nodes. For example, a value of one state may be "1100100101", wherein the one state may be one of maximum $2^N$ states that a network modeled with 10 nodes may have. Here, the network has a state possibly classified by state classification criteria including 'an attractor statee' and 'a non-attractor state'. Here, the 'attractor state' does not transit to another state despite time passes or returns to an initial state value through several state values.

The 'non-attractor state' transits to another state as time passes, but does not return to the 'non-attractor state' but reaches the 'attractor-state'.

Here, a specific 'attractor basin' may be defined as a set including all states that reach a specific 'attractor state' among the 'non-attractor states' as time passes.

The network has characteristics that the 'attractor basin' may be defined by N nodes and M links, which is a set including all 'non-attractor states' that reach the 'attractor state' among the 'non-attractor states' as time passes.

Each intersection point indicated in a 3-dimensional space of FIG. 2 represents each network state that may be defined by combination of values of nodes included in an arbitrary network. 'Potential energy' denoted on a z-axis represents a transition relationship between states. For example, when a state is transited from a first state 201 to a second state 202, it may be defined that the first state 201 has higher 'potential energy' than the second state 202. Accordingly, in FIG. 2, a state positioned at a 'peak' is finally transited to a state positioned at a 'valley'.

FIG. 3 illustrates a state transition diagram for explaining robustness with respect to perturbation in a gene expression system in a living organism represented as the attractor landscape of FIG. 2.

FIG. 3 represents a case where the number of all network nodes in FIG. 1 is four, and represents seven states among possible $2^4$ states and a transition relationship thereof. Each state in FIG. 3 may correspond to a partial area of the landscape represented as a peak to valley form as shown in FIG. 2.

A protein expression level of a node may be abnormally varied by an abnormal temporarily external perturbation. When such a varied state is transited to an arbitrary basin state existing in the state transition diagram, the varied state may be converged on an attractor state on which this basin states converges. Here, when states belong to an identical basin, the varied state finally becomes to converge on the same attractor. Accordingly, if a degree of disturbance due to external perturbation is not large, only a network state temporarily varies and the varied state finally converges on an original state (namely, an attractor). However, it is assumed that temporary external perturbation does not change a shape of the attractor landscape.

SUMMARY

The present disclosure provides a technology enabling a self-repair when errors temporarily occur in one or two state values in a digital circuit outputting a plurality of state values.

The present disclosure also provides a structure and method of repairing faults in a digital circuit by using the above-described technology.

The present disclosure also provides a technology repairing faults in a rapid time when temporary faults occur.

The scope of the present disclosure is not limited hereto.

In accordance with an exemplary embodiment, a digital circuit includes a plurality of unit circuits. The plurality of unit circuits respectively corresponds to different Boolean networks. In addition, each unit circuit is a circuit repairing a maximum 2-bit error state into a normal state.

In accordance with another exemplary embodiment, a digital circuit system includes a digital circuit configured to have a plurality of state values, which is like a digital circuit configured to sequentially output a plurality of bit values. In the digital circuit, a maximum 2 bit values may be abnormally changed. The devised digital circuit system is robust to a temporarily abnormal change of the maximum 2 bit change, while being inspired by a robust structure with respect to external perturbation of the gene expression system of a living organism.

In accordance with yet another exemplary embodiment, a fault self-repairing circuit sequentially converting an N-bit output value according to a pre-determined schedule and outputting the converted result, includes: different N logic modules configured to output each bit of the N bits, wherein each of the logic modules comprises an internal logic, when the N-bit output value is identical to a pre-determined value, an output value of each of the logic modules is provided by the internal logic, when the N-bit output value is not identical to the pre-determined value, the output value of each of the logic modules is provided with a value provided outside each of the logic modules.

In accordance with still another exemplary embodiment, a sequential circuit sequentially switching an output among a plurality of pre-determined N-bit output values according to a value of a state control signal, includes: a fault self-repairing circuit configured to change an internal connection structure according to the N-bit output values to be output by the sequential circuit, and output the N-bit output values; a combinational circuit configured to provide a first N-bit output value which is current output of the fault self-repairing circuit or a second N-bit output value which is next output of the fault self-repairing circuit; and a decision circuit for changing a circuit structure configured to provide a structure control signal for allowing an internal connection structure of the fault self-repairing circuit to be changed according to the N-bit output value which is an output of the sequential circuit, wherein the combinational circuit provides the first N-bit output value when the state control signal has a first value, and provides the second N-bit output value when the state control signal has a second value, and the output value of the combinational value is provided to both the fault self-repairing circuit and decision circuit for changing a circuit structure.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings.

Figure 1:
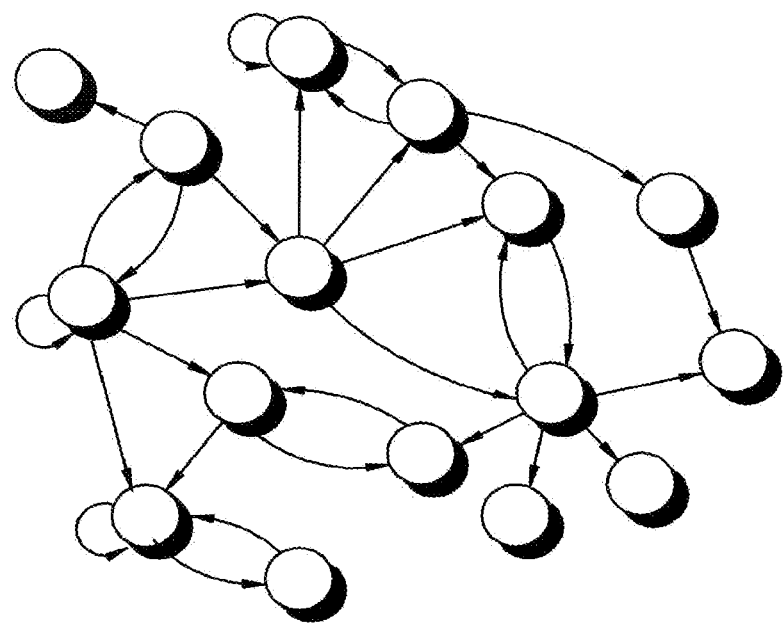
FIGS. 1 to 3 are views for explaining robustness with respect to perturbation in a gene expression system in a living organism by using an attractor landscape.
Figure 2:
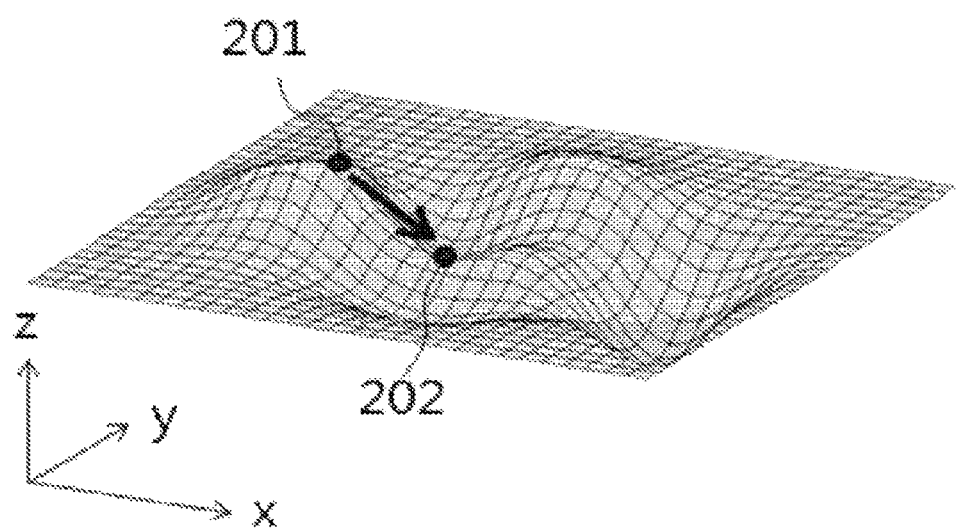
Figure 3:
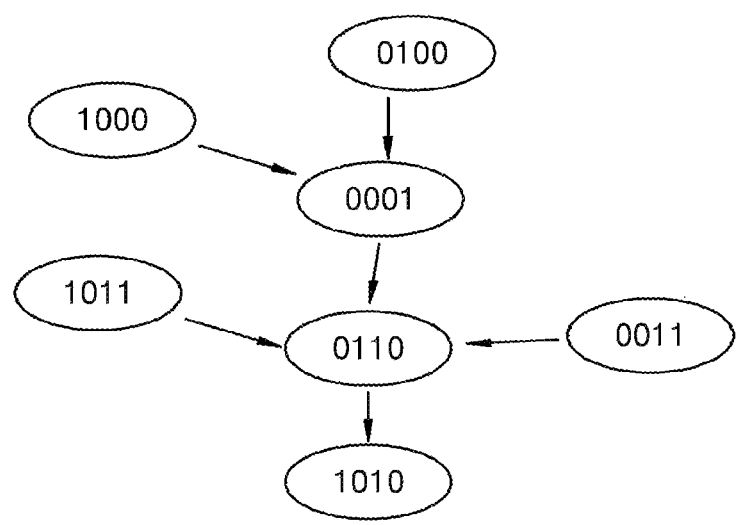
Figure 4:
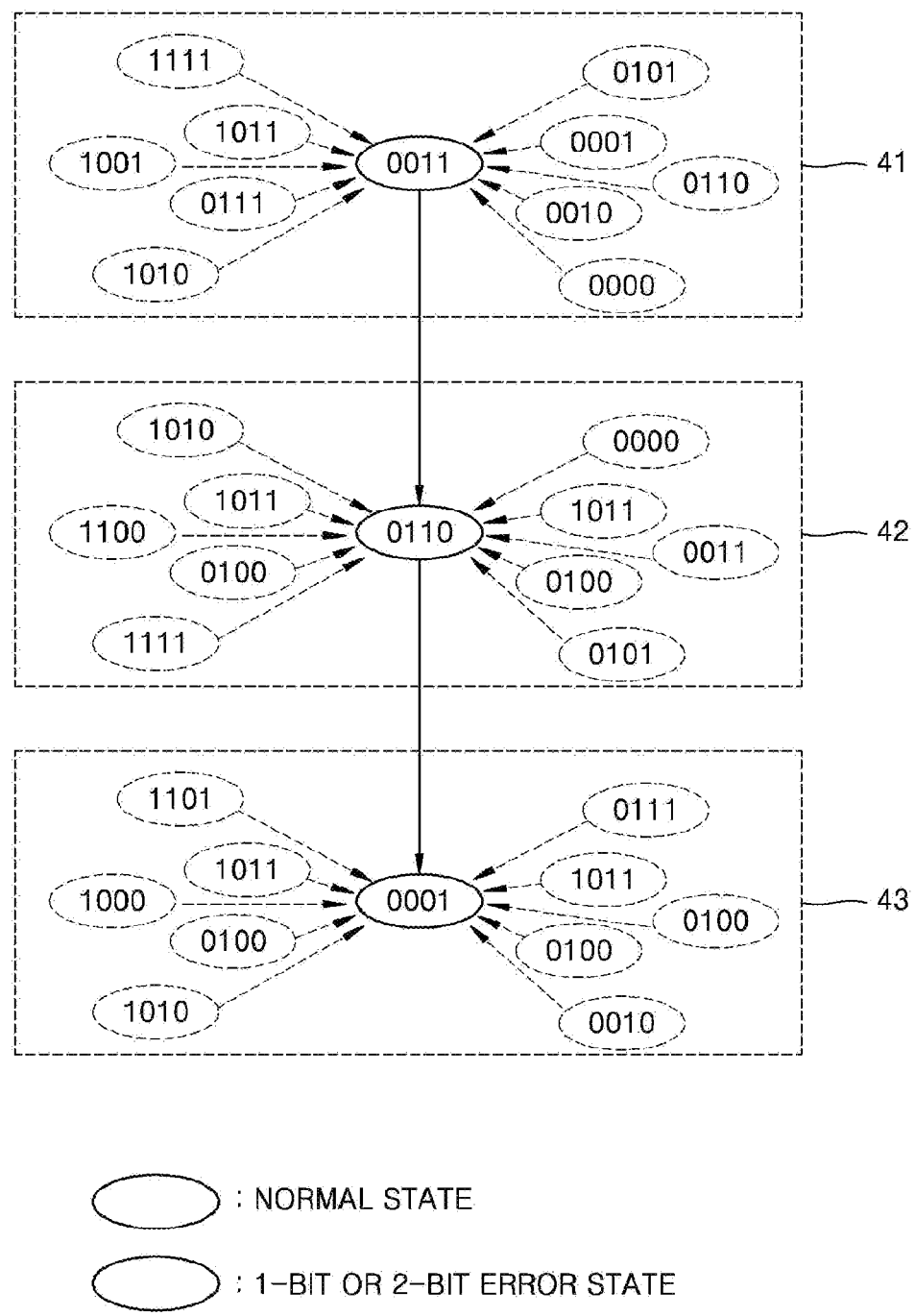
FIG. 4 is a combined state transition diagram representing state transition of a digital sequential circuit in accordance with an exemplary embodiment.

FIG. 4 is a combined state transition diagram representing state transition of a digital sequential circuit in accordance with an exemplary embodiment.

The digital sequential circuit illustrated in FIG. 4 sequentially outputs different 4 bit fixed values. That is, 4 bit three state values (fixed values), '0011', '0110', and '0001' are sequential output. Here, one 4 bit value may be considered as a representative value of one state of the digital sequential circuit.

In an example of FIG. 4, it is assumed that three state values, '0011', '0110', and '0001' may represent that the digital sequential circuit is in a normal state. The three state values are represented inside the solid line circles. A transition relationship between the three state values represents a transition relationship between normal states of the digital sequential circuit.

Furthermore, the states represented inside the dotted line circles represent abnormal output values that the digital sequential circuit may represent. A case where an error occurs only in an arbitrary one bit among 4 bit values may be defined 1-bit erroneous state, and a case where error occurs in two bits may be defined as 2-bit erroneous state. Here, it may be known that total 10 1-bit and 2-bit erroneous states may occur with respect to one normal state.

The present disclosure provides a technology repairing an erroneous state into a corresponding normal state when the above described 1-bit or 2-bit erroneous state occurs.

In FIG. 4, (1) a specific normal state and (2) 10 1-bit and 2-bit erroneous states derived therefrom may be considered as a state that a unit-network (namely, a unit Boolean network) may have. Here, (1) the specific normal state may be interpreted as an attractor of the unit-network, and (2) the 10 1-bit and 2-bit erroneous states may be interpreted to belong to a basin of the attractor.

For FIG. 4, since three normal states exist, it may be interpreted that the digital sequential circuit represents a combined-network into which total three unit-networks are independently combined. Each of three dotted rectangular boxes 41, 42, and 43 in FIG. 4 represents a single unit-network.

In addition, to sequentially output, by the digital sequential circuit, three state values as time passes may be interpreted as that the above-described 3 unit-networks are sequentially activated as time passes.

Here, in an embodiment, each of the above-described unit-networks may be implemented with separate independent unit circuits, the three unit-circuits configured in this way may be mutually combined by using, for example, a multiplexer and provide a combined circuit representing the combined-network.

Alternatively, in another embodiment, while being changed as time passes, an internal structure of one circuit may represent different unit-networks. That is, when the internal structure of the one circuit is sequentially changed to a first structure, a second structure, and a third structure, the first to third structures may respectively represent a first unit-network, a second unit-network, and a third unit-network.

The combined-state transition diagram illustrated in FIG. 4 is that three unit-state transition diagram 41, 42, and 43 are combined. Each of the unit-state transition diagram represents one attractor that each of the unit-networks may have, and ten basins for the one attractor.

Here, an identical state value may commonly exist in different basins belonging to different unit-state transition diagrams. For example, in FIG. 4, a 1-bit erroneous state, '1011', commonly exists in basins belonging to the second unit-state transition diagram 42 and the third unit-state transition diagram 43. Here, it becomes an issue to which the 1-bit erroneous state is repaired among normal state of two normal states of '0110' and '0001'. In this case, when each unit-network is not independently provided, namely, when each unit-circuit is not independently provided, the issue is difficult to address.

Accordingly, in an exemplary embodiment, it may be understood that, when each unit-network is provided as a separate independent unit-circuit and a scheme switching between the unit-circuits is used, the issue may be addressed and all 1-bit and 2-bit erroneous states may be repaired. For example, three unit-networks may be provided by three independent unit circuits (see FIG. 6).

Alternatively, in another exemplary embodiment, a method that a plurality of unit-networks are provided as a single circuit, internal structures inside the single circuit are changed as time passes, and the changed structures which respectively represent different unit-networks may be used (see FIGS. 7 and 8A to 8H).

Figure 5:
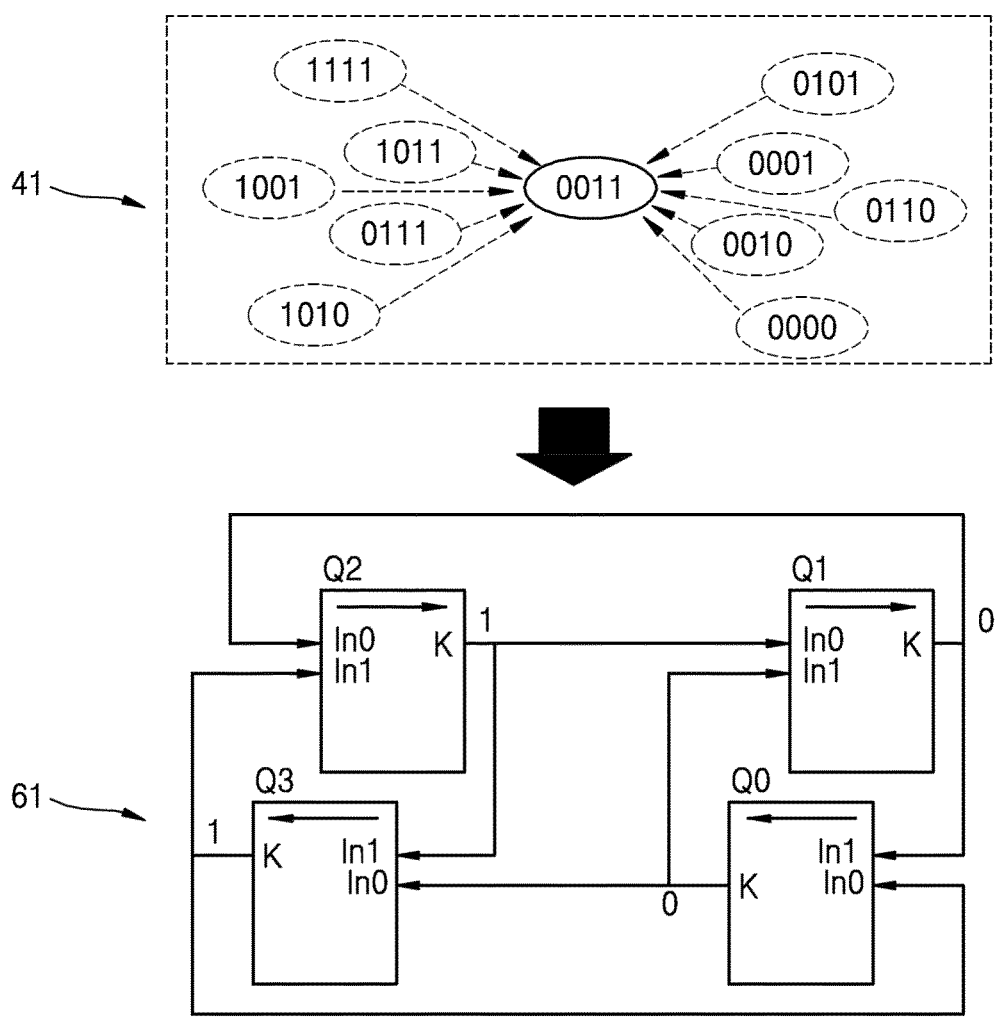
FIG. 5 is a view for explaining a unit circuit in accordance with an exemplary embodiment.

FIG. 5 is a view for explaining a unit-circuit in accordance with an exemplary embodiment.

A first unit circuit 61 illustrated in FIG. 5 is a circuit into which a unit-network representing a single unit-state transition diagram 41 illustrated in FIG. 5 is implemented. A four bit output value from the first unit circuit 61 is a output value from logic modules Q1 to Q4. A first logic circuit 61 outputs '0011', and each internal structure of the four logic modules Q1 to Q4 and a connection relationship between the four logic modules Q1 to Q4 are configured to correct an error, when the error occurs in one bit or two bits of '0011'.

Figure 6:
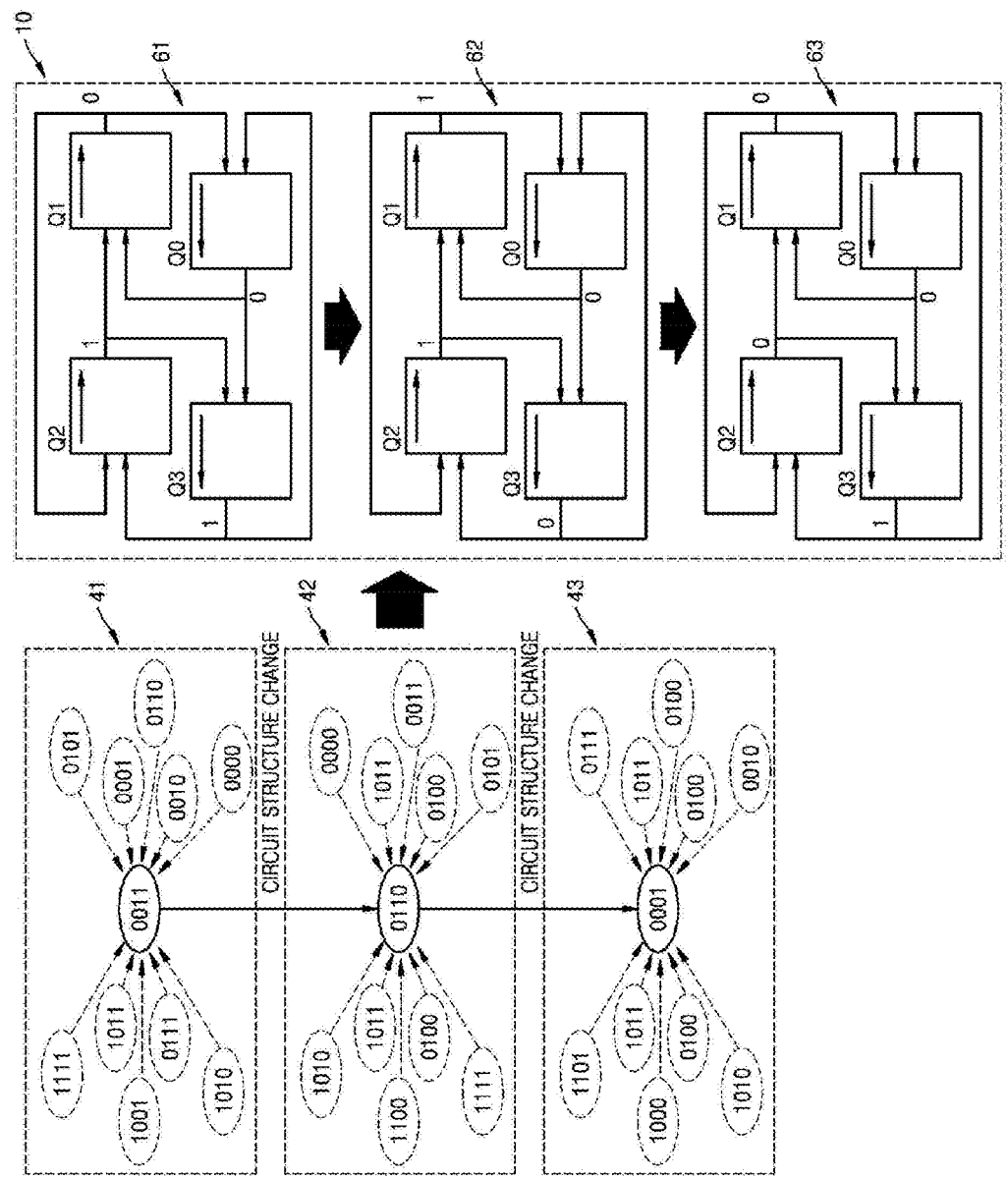
FIG. 6 is a view for explaining a scheme that provides a combined circuit into which a plurality of unit circuits are combined in accordance with an exemplary embodiment.

FIG. 6 is a view for explaining a scheme providing a combined circuit into which a plurality of unit circuits is combined in accordance with an exemplary embodiment.

A combined circuit 10 illustrated in FIG. 6 sequentially outputs total three 4-bit outputs. Each 4-bit output represents each normal state illustrated in FIG. 4.

The combined circuit 10 to be explained in relation to FIG. 6 includes total three unit circuits 61 to 63, and each unit circuit 61 to 63 represents each unit-network. Total three unit circuits are sequentially (61>>62>>63) selected and accordingly for a selected time period, only a single output values intended by each unit circuit 61 to 63 may output. Here, each unit circuit 61 to 63 is a circuit capable of repairing a 1-bit and 2-bit erroneous state, and it may be noted that the circuit may be implemented in various methods.

Figure 7:
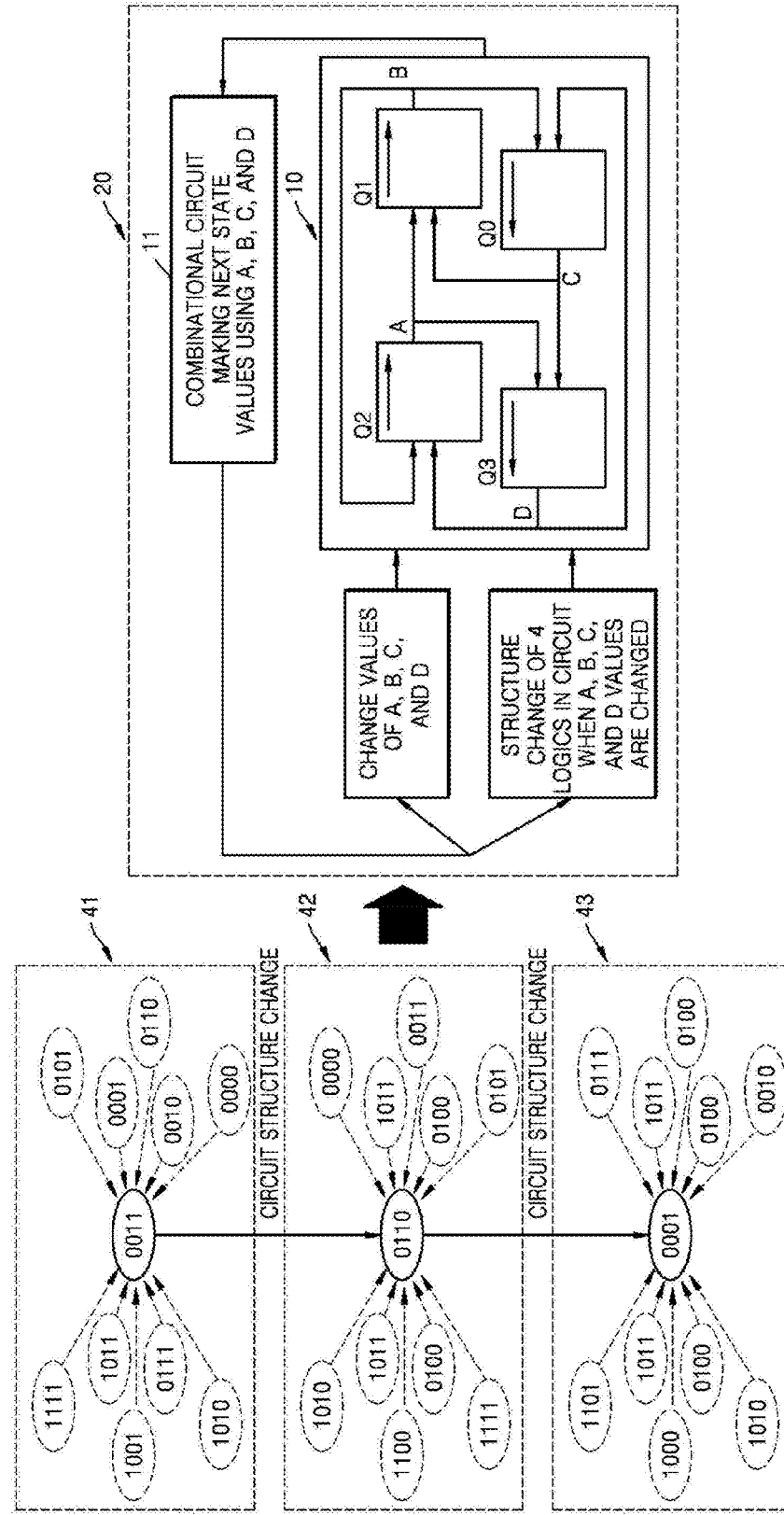
FIG. 7 is a view for explaining a digital sequential circuit 20 including a combined circuit 10 in accordance with an exemplary embodiment.

FIG. 7 is a view for explaining the digital sequential circuit 20 including the combined circuit 10 in accordance with another embodiment.

An output of the combined circuit 10 is input to a combinational circuit 11, and an output from the combinational circuit 11 is input to the combined circuit 10. The combinational circuit 11 may play a role of controlling so that a structure inside the combined circuit 10 may be changed in a pre-determined order.

Embodiment 1

Hereinafter, a sequential circuit in accordance with embodiment 1 is described with reference to FIGS. 8A to 9C.

FIGS. 8A to 8H illustrate embodiments of the structure illustrated in FIG. 7.

A sequential circuit 20 in accordance with embodiment 1 sequentially switches a pre-determined plurality of N (for example, N=4) bit output values (A, B, C, and D) in accordance with a value of a state control signal X, and outputs the switched result. For example, in embodiment 1, three output values "0000", "0101", and "1010" may be sequentially output (in FIG. 8A).

The sequential circuit 20 has an internal connection structure therein, which is changed in accordance with the N bit output values which is an output therefrom, and may include a fault self-repairing circuit (combined circuit) 10 outputting the N-bit output values. In particular, an internal structure of the fault self-repairing circuit 10 may be changed. Here, for example, a portion that the internal structure is changed is a reference numeral 99 in FIGS. 8C and 8D. In FIG. 8C, one of two paths of the reference numeral 99 is selected in accordance with a value of Y1. In addition, in FIG. 8D, one of two paths of the reference numeral 99 is selected in accordance with a value of Y2.

The sequential circuit 20 may further include the combinational circuit 11 providing a first N-bit output value (for example, an output value "0000") currently output by the fault self-repairing circuit 10 or a second N-bit output value (for example, "0101") to be an output in a next time by the fault self-repairing circuit 10. When the state control signal X has a first value (for example, X='0'), the first N-bit output value which is required to be currently output may be an output. When the state control signal X has a second value (for example, X='1'), the second N-bit output value which is required to be output in the next time may be output.

In addition, the sequential circuit 20 may further include a decision circuit for changing a circuit structure 13 providing a structure control signal (for example, Y1 and Y2), which allows the internal connection structure of the fault self-repairing circuit 10 to be changed in accordance with the N-bit output values to be an output by the sequential circuit 20. In an embodiment, the decision circuit for changing a circuit structure 13 outputs total eight signals. That is, the eight signals include two signals (Y1 for MA, Y2 for MA) input to a logic module MA, two signals (Y1 for MB, Y2 for MB) input to a logic module MB, two signals (Y1 for MC, Y2 for MC) input to a logic module MC, and two signals (Y1 for MD, Y2 for MD) input to a logic module MD.

Here, the combinational circuit 11 provides the first N-bit output value (e.g., an output value "0000") when the state control signal X has a first value (e.g., X='0'), and provides the second N-bit output value (e.g., an output value "0101") when the state control signal X has a second value (e.g., X='1').

Here, the state control signal X may be arbitrarily input by a user, or switched between the first and second values by a pre-determined schedule.

In addition, output values (e.g., A+, B+, C+, and D+) of the combinational circuit 11 may be provided to both the fault self-pairing circuit 10 and the decision circuit for changing a circuit structure 13.

Hereinafter, an embodiment of a configuration of the fault self-repairing circuit 10 is described in detail.

The fault self-repairing circuit 10 sequentially converts output values ABCD of N (e.g., N=4) bits in accordance with a pre-determined schedule and outputs the converted result.

Here, the fault self-repairing circuit 10 may include different N logic modules (e.g., MA, MB, MC, and MD) and output each bit (A, B, C, or D) of the N bits (ABCD).

Each of the logic modules MA, MB, MC, and MD may include an internal logic 213.

Here, in each of the logic modules MA, MB, MC, and MD, when an N bit output value is identical to a pre-determined value (e.g., "0000"), an output value of each of the logic modules is provided by the internal logic 213 (namely, the output value of each logic module=W). When the N bit output value (e.g., "0100") is not identical to the pre-determined value (e.g., "0000"), the output value of each of the logic modules is provided by an external circuit (namely, the output value of each logic module=Z+).

Furthermore, each logic module MA, MB, MC, or MD may further include an error detection circuit 212. Here, one or more input terminals I0 and I1 of each logic module MA, MB, MC, or MD receive a value of an output terminal of one or more other logic modules. For example, two input terminals I0 and I1 of the logic module MA receive output values B and D from the logic modules MB and MD.

Here, whether the N-bit output value is identical to the pre-determined value in each logic module MA, MB, MC, or MD is determined by the error detection circuit 212 on the basis of values B and D of output terminals of other logic modules MB and MD and a current output value A of logic module MA. An example provided for the determination is presented in FIG. 8C. A value of Y1 in FIG. 8C may be provided with a mapping table as shown in FIG. 8H.

The table of FIG. 8C provides values of Y1 and Y2 which are to be provided to each logic module. Here, Y1 is determined by two input values I0 and I1 input to each logic module. Y2 may be determined by two input values I0 and I1 input to each logic module and one output value K.

In addition, each logic module MA, MB, MC, and MD may further include a circuit providing normal fixed value 32. On the basis of a determination result value P of the error detection circuit 212, when the N-bit output value is not the pre-determined value, the circuit providing normal value 32 may provide, as the output value K of each logic module (e.g., MA), a pre-determined value Z+ provided outside each logic module (e.g., MA) instead of a value W provided by the internal logic 213. In this embodiment, if an error occurs, the determination result value P of the error detection circuit 212 becomes '1'. Otherwise, the determination result value P becomes '0'.

When an input value Q of the circuit providing normal value 32 is '0', the circuit providing normal value 32 may provide the output value W of the internal logic 213 as the output value K of each logic module (e.g., MA). On the contrary, when the input value Q of the circuit providing normal value 32 is '1', the pre-determined value Z+ provided externally may be provided as the output value K of each logic module (e.g., MA).

Here, the OR module 214 performs a logic OR operation on the determination result value P of the error detection circuit 212 and the state control signal X, and outputs the OR operation result. Accordingly, there are at least two cases where the output value of the OR module 214 become '1'.

First, it is when a value of the state control signal X is '1', namely, when a command for changing an output state of each logic module is issued. Second, it is when the output value P of the error detection circuit 212 becomes '1', namely, when an error occurs in an output value of another logic module, which is connected to the input of the error detection circuit 212.

In addition, one or more input terminals I0 and I1 of each logic module (e.g., MA) may receive values (e.g., B and D) of output terminals of one or more other logic modules (e.g., MB and MD). A value W output from the internal logic 213 may be determined by values (B and D) of output terminals of the one or more other modules MB and MD and a current output value K of each logic module (e.g., MA).

Here, a value Z+ provided outside each logic module (e.g., MA) may be provided from the combinational circuit 11.

Embodiment 2

Hereinafter, embodiment 2 of the present disclosure is described. Embodiment 2 is another version of embodiment 1 described in another view.

In embodiment 2, a structure of the digital sequential circuit 20 is provided which has a fault self-repairing function in accordance with an exemplary embodiment on the basis of state transition having three fixed values, where each fixed value is formed of 4 bits.

Figure 8A:
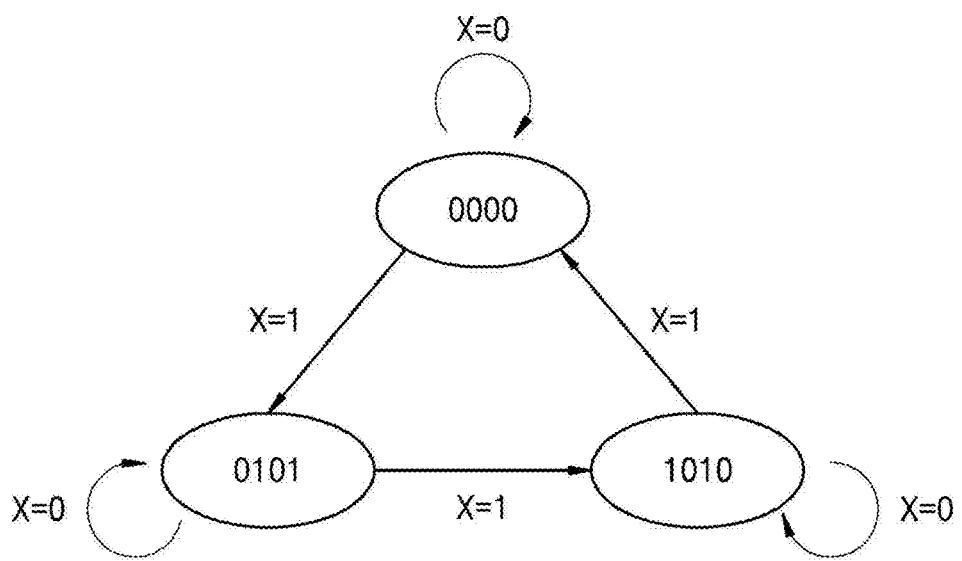
FIG. 8A illustrates a state transition diagram having three fixed values, where each fixed value is composed of 4 bits in accordance with an exemplary embodiment.

FIG. 8A illustrates a state transition diagram having three fixed values, where each fixed value is formed of 4 bits, in accordance with an exemplary embodiment.

Figure 8B:
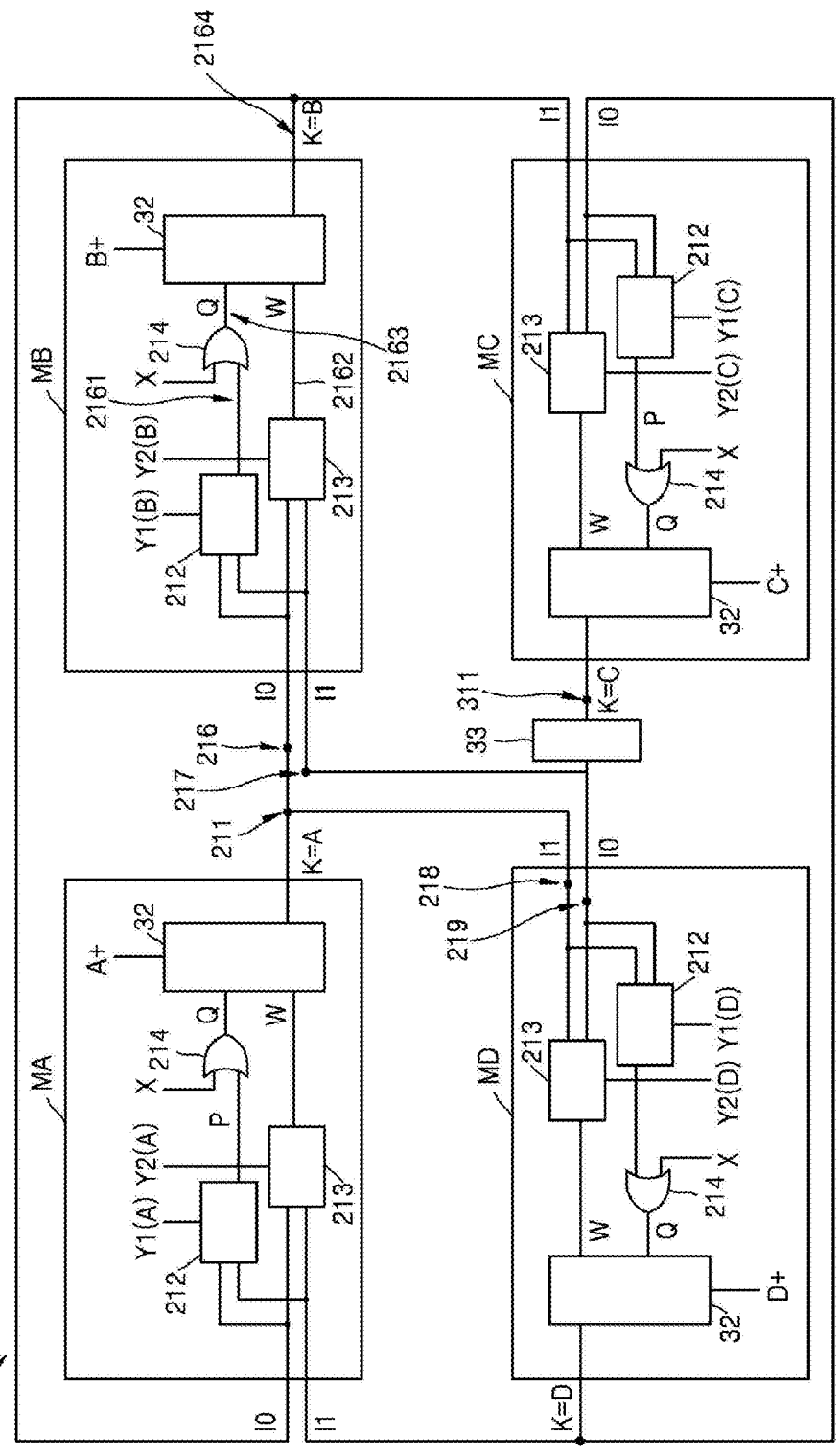
FIG. 8B illustrates a circuit having a self-repair function in accordance with an exemplary embodiment.
Figure 8C:
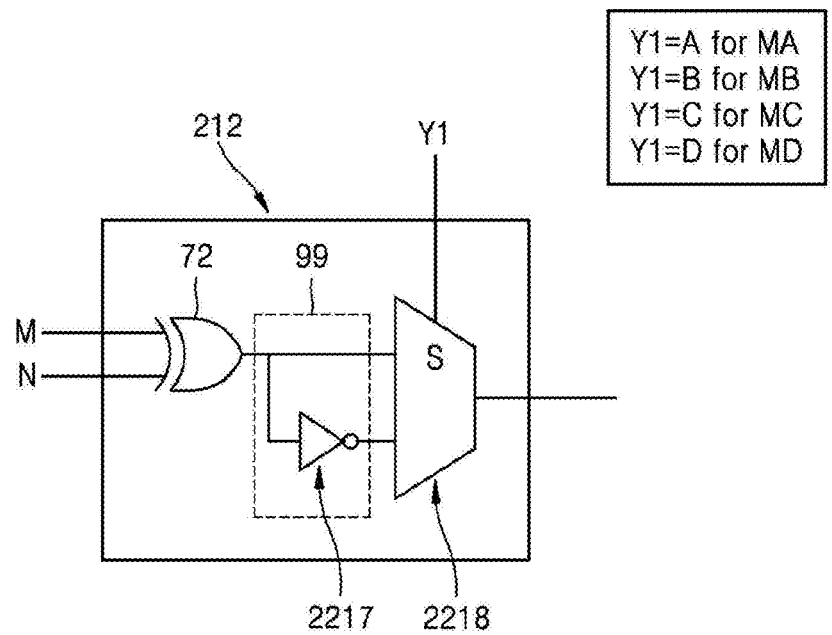
FIG. 8C illustrates an error detection circuit included in FIG. 8B.

FIG. 8B illustrates a circuit having a fault self-repairing function in accordance with an exemplary embodiment.

Figure 8D:
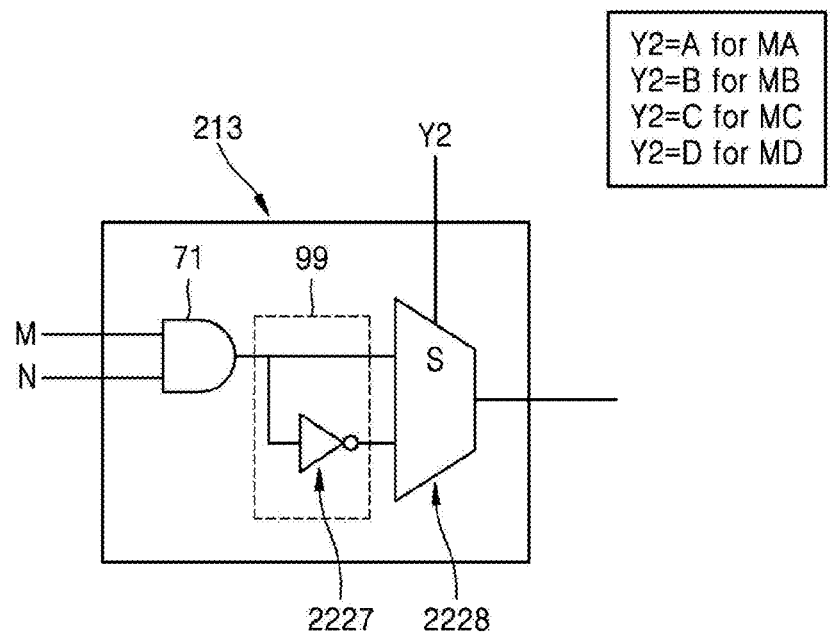
FIG. 8D illustrates internal logics 21 and 22 included in FIG. 8B.
Figure 8E:
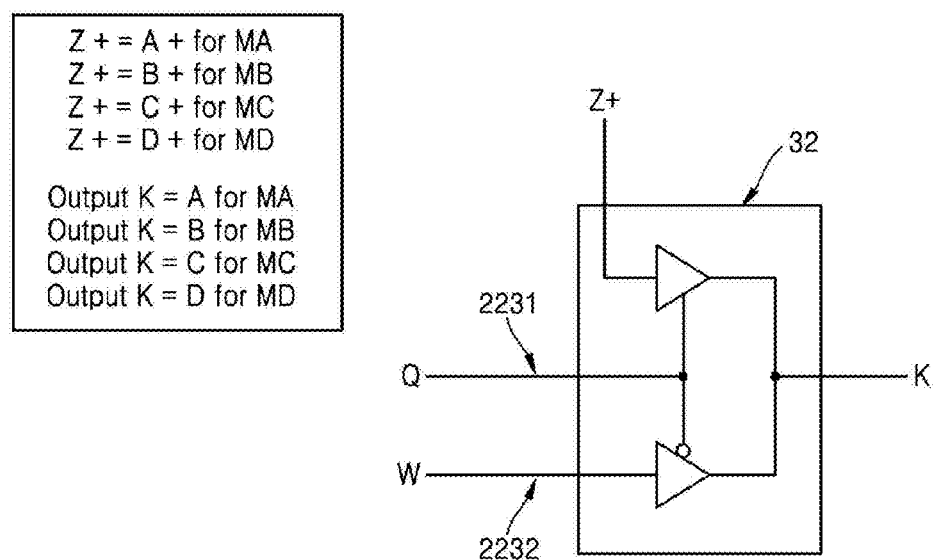
FIG. 8E illustrates circuits for applying normal fixed value 21 and 22 included in FIG. 8B.
Figure 8F:
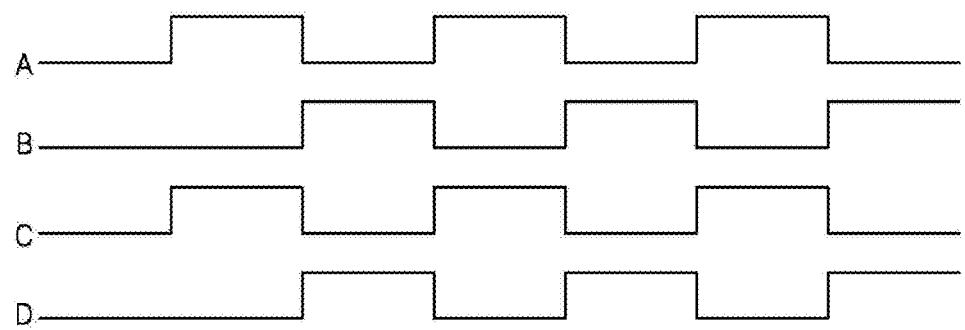
FIG. 8F illustrates an abnormal state according to an error included in FIG. 8B.
Figures 8G, 8H:
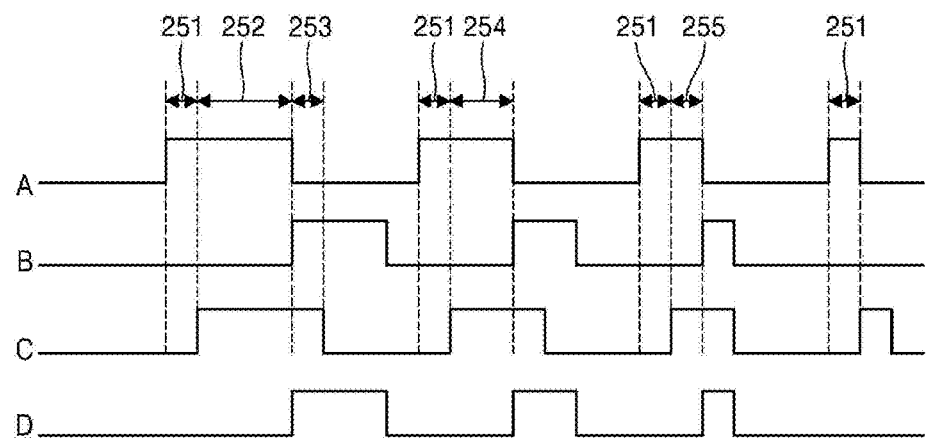
FIG. 8G is a view illustrating that the abnormal state due to the error included in FIG. 8B is repaired.
FIG. 8H illustrates truth tables 21 and 22 of a decision circuit for changing a circuit structure included in FIG. 8B.

FIG. 8C illustrates the error detection circuit 212 included in FIG. 8B;

FIG. 8D illustrates the internal logic 213 included in FIG. 8B;

FIG. 8E illustrates the circuits for applying normal fixed value 32 included in FIG. 8B;

FIG. 8F illustrates an abnormal state according to an error included in FIG. 8B;

FIG. 8G is a view illustrating a principle that an abnormal state due to the error included in FIG. 8B is repaired;

FIG. 8H illustrates a mapping table through which MUX (multiplexer) selection input values Y1 and Y2 of the error detection circuit 212 and the internal logic 213 included in FIG. 8B are determined. The MUX(multiplexer) selection input values Y1 and Y2 may be determined in the decision circuit for changing a circuit structure 13 on the basis of values A+, B+, C+, and D+ output from the combinational circuit 11. That is, information about the mapping table represented in FIG. 8H may be realized in the decision circuit for changing a circuit structure 13.

An exemplary embodiment is described below with reference to FIGS. 8A to 8H.

FIG. 8A illustrates a state transition diagram. A digital sequential circuit 20 in accordance with the embodiment maintains one fixed value among three fixed values formed of 4 bits, '0000', '0101', and '1010', when the state control signal X is '0'.

Here, when 1-bit or 2-bit error occurs in the fixed values to be maintained, the 1-bit or 2-bit error is repaired by using the fault self-repairing circuit (namely, the combined circuit) 10 of FIG. 8. When the state control signal X is '1', the state is consecutively transited among the three fixed values, '0000', '0101', and '1010'. When the state control signal X is '0', the current 4-bit fixed values are maintained without a change. In an exemplary embodiment, internal connection states of the error detection circuit 212 and the internal logic 213 of each logic module MA, MB, MC, and MD are changed according to each maintained fixed value. In addition, these internal connection states are changed by the multiplexers 2218 and 2228 inside the error detection circuit 212 and the internal logic 213. An input-output connection relationship of the multiplexers 2218 and 2228 may be controlled by values of Y1 and Y2 which are selection bits. When the fixed values are maintained in accordance with each logic circuit designed in correspondence to each fixed value, a 'temporary fault' may be repaired.

The 'temporary fault' in the exemplary embodiment means that one or two bits of the 4-bit values are changed into values which are not intended. For example, a situation is assumed that '0000' (a first state) among the three fixed values, '00000 (the first state), '0101' (a second state), and '1010' (a third state) is required to be output. Here, due to a temporary fault occurrence, for example, '0001' (an abnormal state) may be output. In addition, a transition to the second state may be attempted by changing the state control signal X into '1'. However, due to the temporary fault, a transition may be performed to an arbitrary other state which is not the intended second state. Accordingly, before the state control signal X is changed into '1', it is necessary to repair the temporary fault into a normal state. In an embodiment, a circuit repairing the fault into the normal state may be provided.

The state transition diagram of FIG. 8A represents circularly sequential transition performed among the three fixed values formed of 4 bits, '0000', '0101', and '1010'. When the state control signal X is '1', the transition may occur consecutively, and, when the state control signal X is '0', the transition is stopped and a current fixed value is maintained.

FIG. 8B illustrates a fault self-pairing circuit (namely, a combined circuit) 10. When the state control signal X is '0' and an output value of the fault self-repairing circuit 10 is maintained as a fixed value '0000 (4 bits), even when a value of one of 4 bits is changed into 0 or 1 by a temporary fault, namely, even when value '0000' is changed into one of '1000', '0100', '0010', and '0001', the changed value is recovered to '0000' by itself.

Each logic module MA, MB, MC, and MD may include the error detection circuit 212, the internal logic 213, the circuit providing normal value 32, and the OR logic 214 used in changing a fixed value in accordance with state transition.

FIG. 8C illustrates an example of an internal configuration of the error detection circuit 212.

FIG. 8D illustrates an example of an internal configuration of the internal logic 213.

FIG. 8E illustrates an example of an internal configuration of the circuit providing normal value 32.

The logic modules MA, MB, MC, and MD are connected to each other as shown in FIG. 8B. In the connections among logic modules, the logic module MA have outputs from B and D as two inputs, the logic module MB have outputs from A and C as two inputs, the logic module MC have outputs from B and D as two inputs, and the logic module MD have outputs from A and C as two inputs.

Here, the logic modules MA, MB, MC, and MD have circuit structures that change internal connection structures therein by determining selection values Y1 and Y2 of the multiplexers 2218 and 2228, and maintain and store fixed values through this. The selection values Y1 and Y2 may be differed in accordance with the 4-bit fixed values.

When the fixed value is '0000', the selection value Y2 of the multiplexer 2228 of the internal logic 213 becomes '0'. Accordingly, the multiplexer 2228 delivers a value that does not pass through a NOT logic 2227 of the internal logic 213 as an output thereof.

One of inputs of the OR logics 214 inside the logic modules MA, MB, MC, and MD in FIG. 8B receives the state control signal X as an input value. This state control signal X is input externally. When state transition is not attempted, the state control signal X has value '0'. As a result, an output value Q of the OR logic 214 is identical to an output value P of the error detection circuit 212.

In addition, when the output Q of the OR logic 214 is '0', an output value of the circuit providing normal value 32 is identical to an output value W of the internal logic 213.

In such a way, when no fault occurs, an AND logic 71 inside the internal logic 213 may be used and outputs A, B, C, and D in FIG. 8B may be maintained as '0000'.

<Description about a Circuit Operation when a Temporary Fault Occurs>

Hereinafter, a case where an output value 'ABCD' of the combined circuit 10 is intended to be maintained as '0000' is presumptively described.

Here, when a temporary 1-bit fault occurs, an output value A of the logic module MA may be changed into an error value 'A'='1'. In this case, inputs 216 and 217 of the logic module MB and inputs 218 and 219 of the logic module MD may respectively have '10' and '10'.

Here, the output value P of the error detection circuit 212 becomes 'P'='1' by an XOR logic 72 inside the error detecting circuit 212. When a value of the state control signal X is '0', the output value Q of the OR logic 214 becomes identical to '1' which is the output value P of the error detection circuit 212 (namely, 'Q'='1'). Accordingly, '1' is an input to an input terminal 2231 of the circuit providing normal value 32.

The circuit providing normal value 32 includes two tri-state buffers.

When '0' is input to the input terminal 2231, a input value to an input terminal 2232 is an output through an output terminal of the circuit providing normal value 32.

Alternatively, as described above, when the output value A of the logic MA is changed into an error value 'A'='1' due the fault, '1' may be an input to the input terminal 2231 through the above described procedure. Here, a input value to the input terminal Z+ is an output through the output terminal of the circuit providing normal value 32.

A input value to the input terminal Z+ of the circuit providing normal value 32 is A+ output from the combinational circuit 11 in case of the logic module MA, B+ output from the combinational circuit 11 in case of the logic module MB, C+ output from the combinational circuit 11 in case of the logic module MC, and D+ output from the combinational circuit 11 in case of the logic module MD.

A value K output from the output terminal of the circuit providing normal value 32 is A in case of the logic module MA, B in case of the logic module M, C in case of the logic module MC, and D in case of the logic module MD.

<2-Bit Fault Repair>

Furthermore, the fault self-repairing circuit 10 may perform self-repairing from a faulty value to a normal value even when 2-bit fault occurs at the same time. Although each of the logic modules MA, MB, MC, and MD repairs 1-bit fault, 2 bit-fault occurring at the same time may not be repaired in a particular case.

For example, it is assumed that a fixed value is required to be maintained as '0000'. Here, a case may occur that faults simultaneously occur in the logic modules MA and MC, and each output value of the logic modules MA and MC may be '1'. That is, values of an output A 211 which is an output value of the logic module MA and an output C 311 which is an output value of the logic module MC may be all changed into '1'.

In this case, when a delay 33 shown in FIG. 8*b* does not exist, inputs 216 and 217 of the logic module MB and inputs 218 and 219 of the logic module MD all have '11' and '11' at the same time. In addition, outputs of the internal logics 213 inside the logic modules MB and MD have a value '1'. However, due to temporary faults occurring in the output A 211 of the logic module MA and the output C 311 of the logic module MC, even when the outputs A 211 and C 311 are all changed into '1', inputs to the logic modules MA and MB are still maintained as '00'. Accordingly, the outputs A 211 and C 311 become instantaneously changed into '0'. In addition, since the inputs to the logic modules MB and MD respectively have '00' and '00', the output B which is an output value of the logic module MB and the output D which is an output value of the logic module MD are changed back to the normal value '0'. Accordingly, the outputs of the logic modules MA and MC and outputs of the logic modules MB and MD are all alternately repetitively maintained between '00' and '11', and accordingly converged on the abnormal state as shown in FIG. 8F.

This repetitive value change (FIG. 8F) occurred in the fault self-repairing circuit 10 becomes disappeared by the delay 33 shown in FIG. 8B. That is, it may be disappeared by (1) the delay 33 and (2) the AND logics inside the internal logics 213 included in the logic modules MA, MB, MC, and MD.

Referring back to the above-described error occurring situation, each output A 211 and C 311 of the logic modules MA and MC may respectively be an error value '1'. In this case, the output C 311 is delayed by a delay time 251 by the delay 33. Here, since the outputs A 211 and C 311 still deliver an input value '11' to the input terminals of the logic modules MB and MD in a specific time period 252, the AND logics inside the logic modules MB and MD output again a faulty output value '1'. However, the output C 311 is delayed by the delay time 251. Accordingly, for the logic module MA, a time period with a faulty output value becomes shorter and shorter, and finally the faulty value '1' is changed into the normal value '0'. This is because the delay effect has been continuously applied until the faulty value is vanished.

The internal logics 213 of the logic modules MA, MB, MC, and MD of the fault self-repairing circuit 10 in FIG. 8 determine input values Y1 for MA, Y1 for MB, Y1 for MC, Y1 for MD, Y2 for MA, Y2 for MB, Y2 for MC, and Y2 for MD which are selection bits of the multiplexers of the internal logics 213 and the error detection circuit 212, based on a current input and output values of each of the logic modules MA, MB, MC, and MD. Here, the input values Y1 for MA, Y1 for MB, Y1 for MC, and Y1 for MD are determined in accordance with a truth table 241 of FIG. 8H, and the input values Y2 for MA, Y2 for MB, Y2 for MC, and Y2 for MD are determined in accordance with a truth table 242 of FIG. 8H.

When the input values Y1 for MA, Y1 for MB, Y1 for MC, and Y1 for MD have value '0', the output value of the XOR logic 72 inside the error detection circuit 212 is delivered to the output terminal of the error detection circuit 212 without a change. When the input values Y1 for MA, Y1 for MB, Y1 for MC, and Y1 for MD have value '1', the output value of the XOR logic 72 inside the error detection circuit 212 passes through the NOT logic inside the error detection circuit 212 and then is delivered to the output terminal of the error detection circuit 212.

When the input values Y2 for MA, Y2 for MB, Y2 for MC, and Y2 for MD have value '0', the output value of the AND logic inside the internal logic 213 is delivered to the output terminal of the internal logic 213 without a change. When the input values Y2 for MA, Y2 for MB, Y2 for MC, and Y2 for MD have value '1', the output value of the AND logic inside the internal logic 213 passes through the NOT logic inside the internal logic 213 and then is delivered to the output terminal of the error detection circuit 212.

Inputs Y1 for MA, Y1 for MB, Y1 for MC, and Y1 for MD in FIG. 8B are a value of Y1 corresponding to an input of each logic module MA, MB, MC, or MD in the truth table 241, and inputs Y2 for MA, Y2 for MB, Y2 for MC, and Y2 for MD are a value of Y2 corresponding to an input of each logic module MA, MB, MC, or MD in the truth table 242. When fixed value '0000' among fixed values, '0000', '0101', and '1010', in FIG. 8A is maintained, input and output values of the four logic modules MA, MB, MC, and MD are all '0'. Accordingly, the input values Y1 for MA, Y1 for MB, Y1 for MC, Y1 for MD, Y2 for MA, Y2 for MB, Y2 for MC, and Y2 for MD are all '0' according to the truth tables 241 and 242. When the state control signal X is changed from '0' to '1' and fixed value '0000' is transited to fixed value '0101' in FIG. 8A, the values of outputs A+, B+, C+, and D+ are '0101'. Here, when a value of Y2(B) is determined, since inputs of the logic module MB are '00' and the output (A+, C+) is '1'(B+), a value of Y2(B) is determined as '1' according to the truth table 242. In addition, the fault self-repairing circuit (FIG. 8B) that a connection is changed according to inputs Y1 for MA, Y1 for MB, Y1 for MC, Y1 for MD, Y2 for MA, Y2 for MB, Y2 for MC, and Y2 for MD is allowed to return to original fixed values, even when one or two bit values of the 4-bit fixed values are changed due to a temporary fault.

When a value of the state control signal X is '1' in FIG. 8A, three fixed values '0000', '0101', and '1010' are sequentially and circularly transited. This transition process is performed by the combinational circuit 11 of FIG. 9B.

Figure 9A:
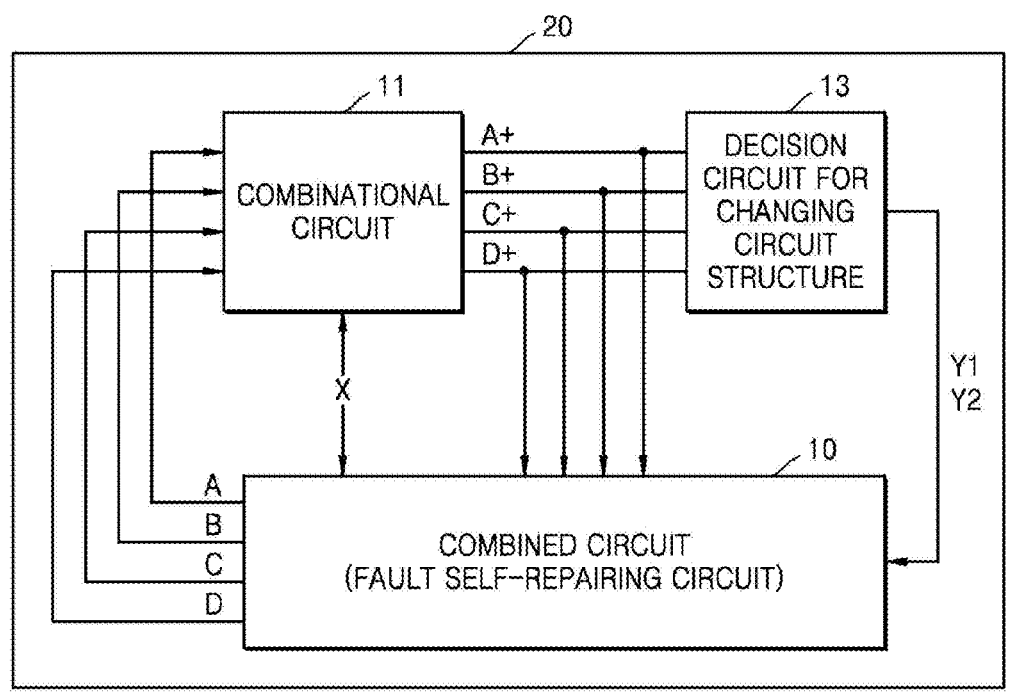
FIG. 9A illustrates a configuration of a digital circuit outputting a plurality of state values and having a self-repairing function for a maximum 2-bit error in accordance with an exemplary embodiment.
Figure 9B:
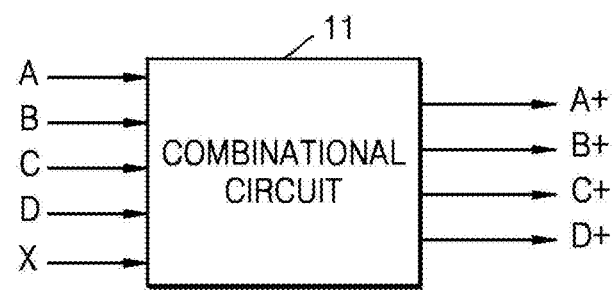
FIG. 9B illustrates a configuration of a combinational circuit 11 capable of receiving an output of a combined circuit 10 and providing data to an input of a combinational circuit 11.
Figure 9C:
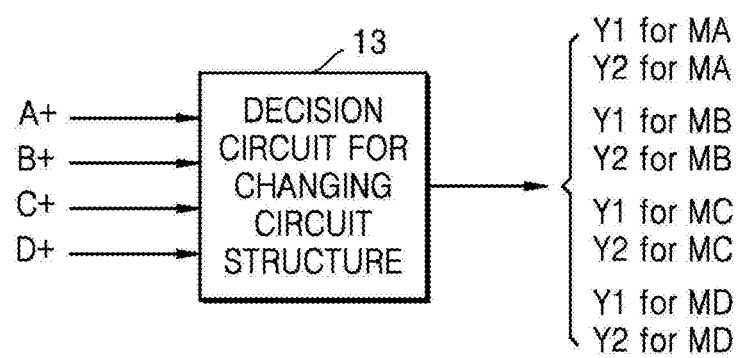
FIG. 9C illustrates a decision circuit for changing a circuit structure outputting a selection bit of a multiplexer included in the combined circuit 10.

Output values (A, B, C, and D) in FIG. 8B are provided as input values to input terminals of the combinational circuit 11 of FIG. 9B. In addition, the outputs A+, B+, C+, and D+ of combinational circuit 11 are connected to the inputs of FIG. 8B.

When a value of the state control signal X is '1', outputs of the OR logics 214 of FIG. 8B unconditionally becomes '1'. Accordingly, in this case, the input terminal of the circuit providing normal value 32 becomes unconditionally '1'.

When the input terminal Q receives an input value '1', the circuit providing normal value 32 of FIG. 8E does not output the output value of the internal logic 213 of FIG. 8B through the output terminal of the circuit providing normal value 32. Instead, the circuit providing normal value 32 outputs a value of the input Z+ (inputs A+, B+, C+, and D+ of the circuit providing normal value 32 of FIG. 8B) of FIG. 8E through the output terminal of the circuit providing normal value 32. Accordingly, the output value of the circuit providing normal value 32 becomes values of A+, B+, C+, and D+, which are outputs of the combinational circuit 11 with respect to the logic modules MA. MB. MC. And MD.

When the value of the state control signal X is changed into '0', the fixed values, which are being output when the value of the state control signal X is changed into '0', remain as the outputs MA, MB, MC, and MD of the fault self-repairing circuit (FIG. 8B). The input Q of the circuit providing normal value 32 becomes '0', and the input W is transferred to the output K of the circuit providing normal value 32. The output P of the error detection circuit 212 is transferred to the output of the OR logic 214. Accordingly, the fault self-repairing circuit (FIG. 8B) becomes a repairable state with respect to the temporary fault.

FIG. 9A illustrates a configuration of a digital circuit outputting a plurality of state values and having a self-repairing function with respect to 1-bit and simultaneous 2-bit error.

FIG. 9A illustrates the combined circuit 10, the combinational circuit 11 and the decision circuit for changing a circuit structure 13 which are described in relation to FIGS. 8A to 9C. Here, an output value of the combined circuit 10 is input to the combinational circuit 11, an output value of the combinational circuit 11 is input to the decision circuit for changing a circuit structure 13 and the combined circuit 10, the state control signal X is input together to the combined circuit 10 and the combinational circuit 11, and the output value Y1 for MA, Y1 for MB, Y1 for MC, Y1 for MD, Y2 for MA, Y2 for MB, Y2 for MC, and Y2 for MD of the decision circuit for changing a circuit structure 13 is input to the combined circuit 10. The output value Y1 for MA, Y1 for MB, Y1 for MC, Y1 for MD, Y2 for MA, Y2 for MB, Y2 for MC, and Y2 for MD is input as a selection bit of the multiplexer included in the combined circuit 10. The output values A+, B+, C+ and D+ of the combinational circuit 11 represent next state output values of the combined circuit 10. For example, when the combined circuit 10 outputs values of a second state A+, B+, C+, and D+ after a first state A, B, C, and D, first state values A, B, C, D are input to the combinational circuit 11. When a value of the state control signal X is input as '1', the combinational circuit 11 outputs other second state values A+, B+, C+, and D+. The state control signal X changed into '1' is input to the input of the OR logic 214 in the combined circuit, the circuit providing normal value 32 receives this as the input Q. When Q is '1', the second state values A+, B+, C+, and D+ are output as the outputs of the logic modules MA, MB, MC, and MD by outputting the input values of Z+(A+, B+, C+, D+) to the output value K. In addition, when the second state values A+, B+, C+ and D+ are input to the decision circuit for changing a circuit structure 13, the decision circuit for changing a circuit structure 13 determines input values Y1 for MA, Y1 for MB, Y1 for MC, Y1 for MD, Y2 for MA, Y2 for MB, Y2 for MC, and Y2 for MD of the multiplexers in order that the combined circuit 10 form the internal logic 213 and the error detection circuit 212 capable of storing and repairing the second state values A+, B+, C+, and D+. Accordingly, when the fixed values changes from the first state values A, B, C, and D into the second state values A+, B+, C+, and D+, the internal logic 213 has currently changed fixed values A+, B+, C+, and D+ as the outputs of the logic modules MA, MB, MC, and MD. The logic module MA has the fixed values B+ and D+ as the input thereof, the logic module MB has the fixed values A+ and C+ as an input thereof, the logic module MC has the fixed values B+ and D+ as an input thereof, and the logic module MD has the fixed values A+ and C+ as an input thereof. In a configuration of the fault self-repairing circuit, whether to pass the NOT logic inside the internal logic 213 is determined according to input values Y1 for MA, Y1 for MB, Y1 for MC, Y1 for MD of the multiplexers, which are determined according to the truth table 241 by adopting the input and output values of the logic modules MA, MB, MC, and MD as normal values. The fault self-repairing circuit maintains new state values A+, B+, C+, and D+. In addition, in a configuration of the fault self-repairing circuit, whether to pass the NOT logic inside the error detection circuit 212 is determined according to input values Y2 for MA, Y2 for MB, Y2 for MC, Y2 for MD of the multiplexers, which are determined according to the truth table 242 by adopting the input and output values of the logic modules MA, MB, MC, and MD as normal values. The fault self-repairing circuit determined inputs and outputs of the new state values A+, B+, C+, and D+ as normal values and maintains a structure that determines an error, when the error temporarily occurs in one bit among the state values A+, B+, C+, and D+.

Hereinafter, the fault self-repairing circuit and self-repairing sequential circuit according to an exemplary embodiment are described with reference to FIGS. 8A to 9C.

The fault self-repairing circuit 10 according to an exemplary embodiment sequentially outputs a first fixed value (e.g., '0000') and a second fixed value (e.g., '0101') composed of 4 bits and includes a first fault self-repairing circuit, a second fault self-repairing circuit, and a multiplexer. The first fault self-repairing circuit (e.g., a connection combination of the logic modules MA, MB, MC, and MD having a specific configuration of the internal circuit according to Y1 for MA, Y1 for MB, Y1 for MC, Y1 for MD, Y2 for MA, Y2 for MB, Y2 for MC, and Y2 for MD) outputs the first fixed value, and, when an error occurs in an arbitrary one or simultaneous two bits among the first fixed value, faulty bits are repaired by itself. The second fault self-repairing circuit (e.g., a connection combination of the logic modules MA, MB, MC, and MD having specific internal circuit configurations in the multiplexers according to Y1 for MA, Y1 for MB, Y1 for MC, Y1 for MD, Y2 for MA, Y2 for MB, Y2 for MC, and Y2 for MD which are changed according to output values of a new combinational circuit) outputs the second fixed value, and, when an error occurs in an arbitrary one or simultaneous two bits among the second fixed value, repairs the error. Each of the multiplexers includes a first input terminal that does not pass a NOT logic and a second input terminal that passes the NOT logic. Selection signals Y1 for MA, Y1 for MB, Y1 for MC, Y1 for MD, Y2 for MA, Y2 for MB, Y2 for MC, and Y2 for MD for selecting the first and second input terminals are input to selection input terminals of the multiplexers.

The fault self-repairing circuit 10 according to another exemplary embodiment may sequentially converts (0000, 0101, and 1010) N-bit (4-bit) output values MA, MB, MC, and MD according to a pre-determined schedule. The fault self-repairing circuit 10 may include different N logic modules MA, MB, MC, and MD outputting each bit of the N bits. Each of the logic modules may include multiplexers 2218 and 2228 selecting one of internal configurations of the plurality of logic modules according to the N-bit value of logic modules and a delay 33 delaying output values of the logic modules MA. MB, MC, and MD, wherein the output values of the multiplexers 2218 and 2228 have the same values as the output values of MA, MB, MC, and MD. Here, the output value of each of the logic modules MA, MB, MC, and MD is an input to other logic modules, and a delay value of the delay 33 may vary.

The fault self-repairing sequential circuit according to another exemplary embodiment may include the fault self-repairing circuit 10, the combinational circuit 11, and the decision circuit for changing a circuit structure 13. A configuration of the fault self-repairing circuit 10 is the same as that of the above-described embodiment. The combinational circuit 11 receiving the output values MA, MB, MC, and MD of the fault self-repairing circuit 10 outputs the next state values A+, B+, C+, and D+ that the fault self-repairing circuit 10 is required to represent, providing the next state values for the fault self-repairing circuit 10. The decision circuit for changing a circuit structure 13 receives the next state values A+, B+, C+, and D+, and outputs signals Y1 for MA, Y1 for MB, Y1 for MC, Y1 for MD, Y2 for MA, Y2 for MB, Y2 for MC, and Y2 for MD for controlling the selection bit of the multiplexer inside the fault self-repairing circuit 10 according to the next state values A+, B+, C+, and D+.

According to the present disclosure, a digital circuit formed by combining a plurality of unit circuits designed for each output state unit is provided. Accordingly, a high guarantee rate of fault repair can be ensured by repairing a fault when the fault temporarily occurs in an arbitrary portion inside a unit circuit. In addition, reliability of a digital circuit according to the present disclosure can be increased by allowing each unit circuit included in the digital circuit to asynchronously repair a fault.

The scope of the present disclosure is not limited hereto.

Although the self-repairable digital device for multiple faults based on biological attractor concepts has been described with a reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A fault self-repairing circuit, comprising:
a total of N logic modules, each of which is configured to output one-bit binary number, the N being an integer number larger than one (1), wherein, for each of the N logic modules:
(1) the logic module comprises an internal logic, a normal value providing circuit, and an error detection circuit,
(2) the error detection circuit is configured to receive two values and to determine whether there is or not an error in the received two values, each of the two values being output from two other logic modules among the total of N logic modules respectively, and
(3) the logic module is configured such that,
A. if there is no error in the received two values, a value output from the error detection circuit has a first value which controls the normal value providing circuit to select a value output from the internal circuit in order to output the value output from the internal circuit as an output of the logic module,
B. otherwise, if there is an error in the received two values, the value output from the error detection circuit has a second value which controls the normal value providing circuit to select a value provided from a combinational circuit outside the fault self-repairing circuit in order to output the value provided from the combinational circuit as the output of the logic module,
wherein, the combinational circuit determines an output value of N-bits format to provide the fault self-repairing circuit with the determined output value of N-bits format.

2. The fault self-repairing circuit of claim 1, wherein, for each of the N logic modules:
whether there is or not an error in the received two values is determined based on an output value output from the logic module and the received two values.

3. The fault self-repairing circuit of claim 1, wherein N is four (4).

4. The fault self-repairing circuit of claim 1, wherein for each of the N logic modules:
the value output from the internal logic is determined based on an output value output from the logic module and the received two values.

5. The fault self-repairing circuit of claim 1, further comprising a delay device, wherein a value output from one logic module among the total of N logic modules is transmitted to other part of the fault self-repairing circuit through the delay device.

6. A sequential circuit, comprising:
a fault self-repairing circuit comprising a total of N logic modules, each of which is configured to output one-bit binary number, the N being an integer number larger than one (1);
a combinational circuit configured to determine an output value of N-bits format to provide the fault self-repairing circuit with the determined output value of N-bits format, and change the output value of N-bits format according to a value of a state control signal; and
a decision circuit for changing a circuit structure configured to provide with a structure control signal for making an internal connection structure of the fault self-repairing circuit to be changed according to the output value of N-bits format provided by the combinational circuit;
wherein, the sequential circuit is configured such that each bit of the output value of N-bits format determined by the combinational circuit is provided to a corresponding one of the total of N logic modules,
wherein, for each of the N logic modules:
(1) the logic module comprises an internal logic, a normal value providing circuit, and an error detection circuit,
(2) the error detection circuit is configured to receive two values and to determine whether there is or not an error in the received two values, each of the received two values being output from two other logic modules among the total of N logic modules respectively, and
(3) the logic module is configured such that,
A. if there is no error in the received two values, a value output from the error detection circuit has a first value which controls the normal value providing circuit to select value output from the internal logic in order to output the value output from the internal logic as an output of the logic module,
B. otherwise, if there is an error in the received two values, the value output from the error detection circuit has a second value which controls the normal value providing circuit to select one bit among the output value of N-bits format provided to the logic module in order to output the one bit as the output of the logic module,
(4) an internal structure of the logic module is changed according to the value of the state control signal, and
(5) when the state control signal has a first signal value which makes the normal value providing circuit to change the output value of N-bits format, the normal value providing circuit outputs the one bit of the output value of N-bits format provided to the logic module.

7. The sequential circuit of claim 6, wherein the N is four (4).

8. The sequential circuit of claim 6, wherein, for each of the N logic modules:
whether there is or not an error in the received two values is determined based on an output value output from the logic module and the received two values.

9. The sequential circuit of claim 6, wherein for each of the N logic modules:

the value output from the internal logic is determined based on an output value output from the logic module and the received two values.

* * * * *